(12) United States Patent
Sillmon et al.

(10) Patent No.: US 6,325,855 B1
(45) Date of Patent: Dec. 4, 2001

(54) GAS COLLECTOR FOR EPITAXIAL REACTORS

(75) Inventors: Roger S. Sillmon, Troutville; Khang V. Nguyen, Salem, both of VA (US)

(73) Assignee: ITT Manufacturing Enterprises, Inc., Wilmington, DE (US)

(*) Notice: Subject to any disclaimer, the term of this patent is extended or adjusted under 35 U.S.C. 154(b) by 0 days.

(21) Appl. No.: 09/635,268

(22) Filed: Aug. 9, 2000

(51) Int. Cl.[7] .................................................. C23C 16/00

(52) U.S. Cl. ............................................. 118/715

(58) Field of Search .............................. 118/715

(56) References Cited

U.S. PATENT DOCUMENTS

| 4,961,399 | 10/1990 | Frijlink | 118/715 |
| 4,976,217 | 12/1990 | Frijlink | 118/715 |

*Primary Examiner*—Richard Bueker
(74) *Attorney, Agent, or Firm*—McDermott, Will & Emery

(57) ABSTRACT

A gas collector is disclosed for use with epitaxial reactors. The gas collector is in the form of a base and top portion that are interconnected by means of a sealing arrangement. The top portion is configured to cover the base and define a conduit therebetween. Inlets and outlets are provided to direct chemical vapors from a reaction chamber of the epitaxial reactor into the conduit and further into an exhaust pipe of the epitaxial reactor. The gas collector is capable of forming a hermetic seal with the lid of the reaction chamber in order to prevent escape of chemical vapors.

14 Claims, 3 Drawing Sheets

GAS COLLECTOR FOR EPITAXIAL REACTORS

BACKGROUND OF THE INVENTION

1. Technical Field

The present invention relates to epitaxial reactors and, more particularly, to a gas collector for epitaxial reactors.

2. Description of the Related Art

Continuing advances in the microchip industry have resulted the development of highly complex thin-film deposition processes for fabricating semiconductor devices that are packaged for use in the manufacture of sophisticated electronic devices. Thin films of material that are deposited on semiconductor wafers are often referred to as epitaxial layers. High speed electronic transistors, quantum-well diode lasers, light-emitting diodes, photodetectors, and optical modulators incorporate structures composed of numerous epitaxial layers ranging in thickness from several microns to as thin as a few tenths of a nanometer. These epitaxial layers are typically deposited, or grown, on a single-crystal substrate, i.e., the semiconductor wafer.

One method of forming epitaxial layers on a semiconductor wafer is known as chemical vapor deposition (CVD). In a typical manufacturing process of a wafer, for example, silicon in extremely pure crystalline form is overlayed sequentially with numerous layers of materials which function as conductors, semiconductors, or insulators. Each subsequent layer is ordered and patterned such that the sequence of layers forms a complex array of electronic circuitry. The semiconductor wafer is subsequently cut along predetermined scribe lines into individual devices, commonly referred to as "chips." These chips ultimately function as key components in electronic devices ranging from simple toys to complex supercomputers.

CVD processes normally take place within a device such as, for example, a radial flow reactor, that includes a reaction chamber. The semiconductor wafer is initially placed within a reaction chamber, which typically contains an inert atmosphere. The temperature within the reaction chamber is elevated and chemical vapors containing the compound or element to be deposited are introduced to react with the surface of the semiconductor wafer. This process results in deposition of the required film. The chemical vapors are continually introduced and removed from the reaction chamber until a requisite film thickness has been achieved.

Reaction chambers are typically constructed from a perforated section of sheet metal that is cut and folded into a segmented conduit of polygonal configuration. The segments are closely aligned so as to form a semi-continuous loop. The reactor chamber lid is pressed against the top of the conduit formed by the sheet metal in order to provide a seal between the conduit and the reactor chamber lid. Inlets and outlets are provided for the chemical vapors along inner and outer circumference of the conduit, respectively.

One problem associated with such reaction chambers is that the semi-continuous nature of the conduit does not always form a gas, or hermetic, seal the reactor chamber lid. Accordingly, chemical vapors are allowed to escape from the conduit to other parts of the reaction chamber prior to being channeled to the exhaust pipes. Another problem with such reaction chambers is the potential for contamination resulting from repeated flexing of the sheet metal over repeated openings of the reactor chamber lid. More particularly, each time the reactor chamber is opened, the conduit flexes along the same perforations and bending points. Over time, metal particulates will flake off the sheet metal and contaminate the inert atmosphere of the reaction chamber.

There exists a need for a gas collector capable of preventing the escape of chemical vapors removed from an epitaxial reactor. There also exists a need for a gas collector that minimizes the level of contamination into the epitaxial reactor.

SUMMARY OF THE INVENTION

These and other needs are addressed by the present invention, wherein a gas collector is constructed from solid components that are capable of forming a hermetic seal with the lid of an epitaxial reactor.

In accordance with the present invention, a gas collector for an epitaxial reactor comprises a base, a top portion, and a sealing arrangement. The sealing arrangement is operatively coupled to the base and top portion. The base has a U-shaped cross-section and a generally circular configuration. The top portion is configured to cover the base such that a conduit is defined between the base and the top portion. A plurality of inlets are provided to direct chemical vapors from the reactor into the conduit. Additionally, at least one outlet is provided for directing the chemical vapors from the conduit to an exhaust pipe of the epitaxial reactor. According to such an arrangement, the top portion of the gas collector is capable of forming a hermetic seal with the lid of the epitaxial reactor's reaction chamber. Furthermore, the potential for contamination is reduced because the components of the gas collector are formed from solid pieces of material that do not flex or bend.

Additional advantages and novel features of the present invention will be set forth in part in the description which follows, and in part will become apparent to those skilled in the art upon examination of the following, or may be learned by practice of the present invention. The embodiments shown and described provide an illustration of the best mode contemplated for carrying out the present invention. The invention is capable of modifications in various obvious respects, all without departing from the spirit and scope thereof. Accordingly, the drawings and description are to be regarded as illustrative in nature, and not as restrictive. The advantages of the present invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

DETAILED DESCRIPTION OF THE INVENTION

Figure 1:
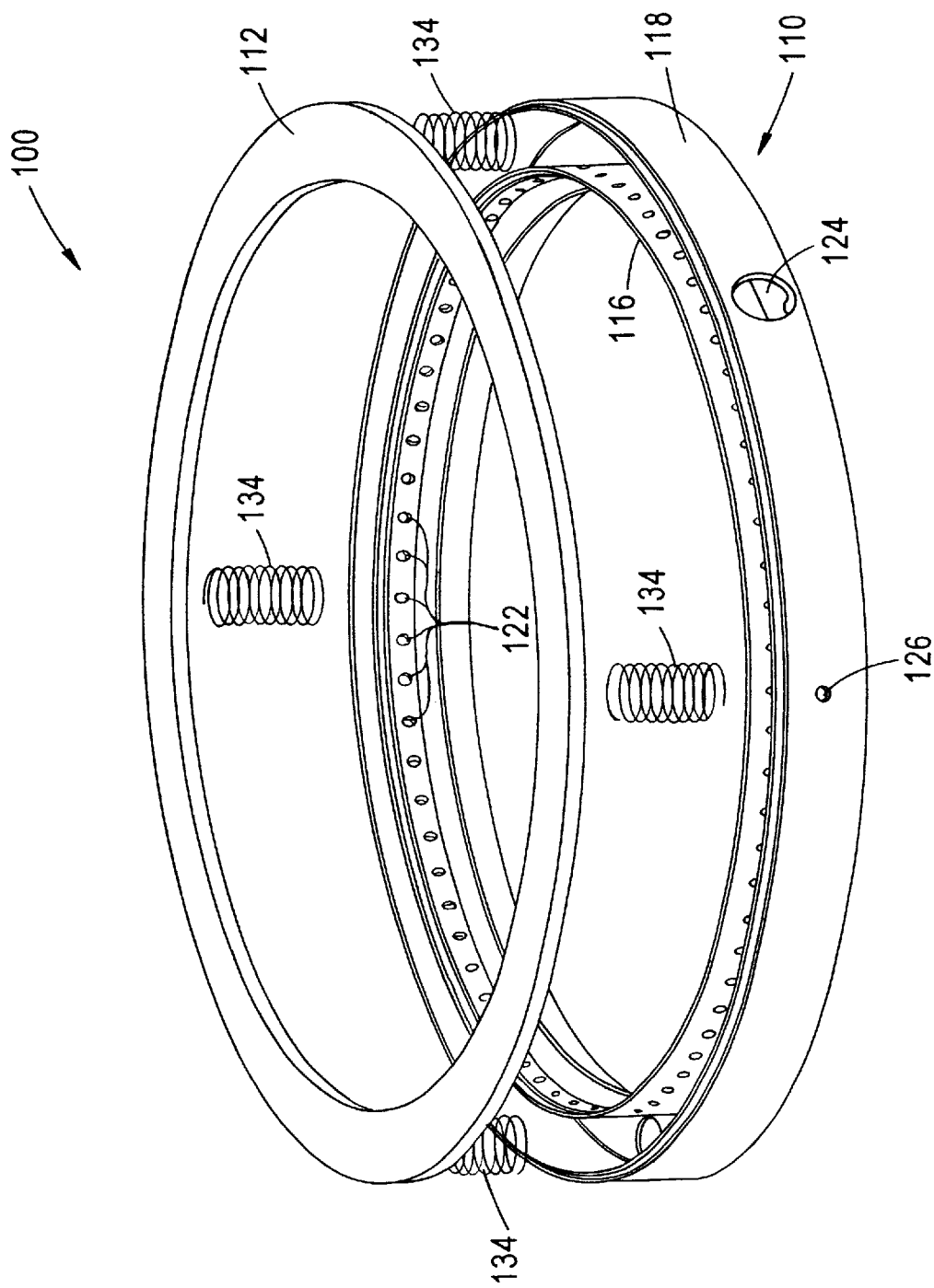
FIG. 1 is an exploded view of a gas collector constructed in accordance with the present invention.

With reference to the drawings, and initially to FIG. 1, there is shown a gas collector 100 for an epitaxial reactor (not shown) constructed in accordance with the present invention. The gas collector 100 included a base 110 and a top portion 112. A sealing arrangement 114 is additionally provided to facilitate the formation of a gas seal (i.e., hermetic seal) between the top portion 112 and a lid of the epitaxial reactor. As can be appreciated, the gas collector 100 of the present invention primarily functions to collect chemical vapors (i.e., reactive gases from chemical vapor deposition) from a reaction chamber of the epitaxial reactor, and direct the chemical vapors to the epitaxial reactor's exhaust pipes.

As illustrated in FIG. 1, the base 110 of the gas collector 100 has a generally circular configuration when examined from a top plan view. The base 110 includes an inner wall 116 and an outer wall 188, both of which extend from a bottom portion thereof. The particular arrangement of the inner and outer walls 116, 118 results in a U-shaped cross-section for the base 110. Accordingly, a conduit 120 is defined between the top portion 112 and the interior of the base 110.

According to the disclosed embodiment of the present invention, the gas collector includes a plurality of inlets 122 that allow chemical vapors to enter the conduit 120. The inlets 122 are in the form of apertures and are disposed along the inner wall 116 of the base 110. At least one outlet 124 is provided to direct the chemical vapors from the conduit 120 to the exhaust pipe of the reactor. As illustrated in FIG. 1, the outlet 124 is formed on the outer wall 118 of the base 110. Depending on the specific application and/or size of the conduit, multiple outlets 124 can be provided to direct chemical vapors from the conduit 120. In such cases, the outlets 124 are preferably provided in pairs, and positioned such that pairs of outlets 124 are diametrically opposite of each other (i.e., 180° apart). In other words, each outlet 124 is in alignment with a corresponding outlet 124 according to an alignment line (not shown) passing through the center of the gas collector 100.

According to one embodiment of the invention, at least one secondary inlet 126 can be formed on the outer wall 118 of the base 110. The secondary inlet 126 facilitates introduction of purge gas into the conduit. The purge gas ensures that there is no substantial pressure difference between the inner and outer areas of the reactor chamber. More particularly, the secondary inlet 126 provide a pathway for introducing purge gas from the outer portions of the reactor chamber into the conduit 120 and out to the exhaust pipes. As can be appreciated, the number of secondary inlets 126 provided will depend on the particular epitaxial reactor and the amount of chemical vapor that is present. A control system can be optionally provided to meter the volume of purge gas being introduced into the conduit 120 in order to prevent chemical vapors within the conduit from entering the outer area of the reaction chamber via the secondary inlet 126.

With continued reference to FIG. 1, and additional reference to FIGS. 2 and 3, the sealing arrangement 114 will now be described. The sealing arrangement 114 is formed as part of the base 110 and top portion 112 of the gas collector in order to minimize the number of moving parts. For example, the disclosed embodiment of the present invention shows a pair of concentric grooves 130 that are formed on the bottom surface of the top portion 112. In addition, a mating projection 132 extends from the end of the inner wall 116 and the end of the outer wall 118. The mating projections 132 are specifically designed for insertion and engagement with the concentric grooves 130 of the top portion 112. Depending on the specific application, the mating projections 130 can be constructed to possess a predetermined level of resiliency to better engage the concentric grooves 130.

The gas collector 100 of the present invention is designed to form a hermetic seal with the door of the reaction chamber in order to prevent chemical vapors from entering other parts of the reactor by means of passages formed between the lid of the reaction chamber and the top portion 112. According to one embodiment of the present invention, a plurality of resilient members can be disposed within the conduit to exert pressure against the top portion 112 when the lid of the reaction chamber is closed. Preferably, the resilient members are in the form of helical springs 134, as shown in FIGS. 1 and 2. Alternatively, any resilient member capable of withstanding the operating conditions of the gas collector and capable of exerting the proper amount of force on the top portion 112 can be used. The springs 134 are designed to exert an amount of force sufficient to form a hermetic seal between the top portion 112 and the lid of the reaction chamber.

As illustrated in FIG. 1, the springs 134 are arranged such that the force against the top portion 112 is evenly distributed. Additionally, the base 110 can include a plurality of seats 136 corresponding to the number of springs 134. Each seat 136 is in the form of a recess, or counter-sunk hole, within the bottom surface of the base 110. Each seat 136 is configured to receive a spring 134 therein and prevent lateral movement of the spring 134. The springs 134 have a diameter that is nearly equal to the size of the conduit 120. However, the spacing formed by the coils of the springs 134 allow chemical vapors to pass through the conduit 120 with very little resistance.

According to an alternative embodiment of the present invention, the mating projections 130 can be constructed to possess a predetermined level of resiliency in order properly form a hermetic seal between the top portion 112 and the lid of the reaction chamber. Furthermore, the degree of resiliency can depend on the particular epitaxial reactor and the amount of pressure applied by the lid of the reaction chamber.

Figure 2:
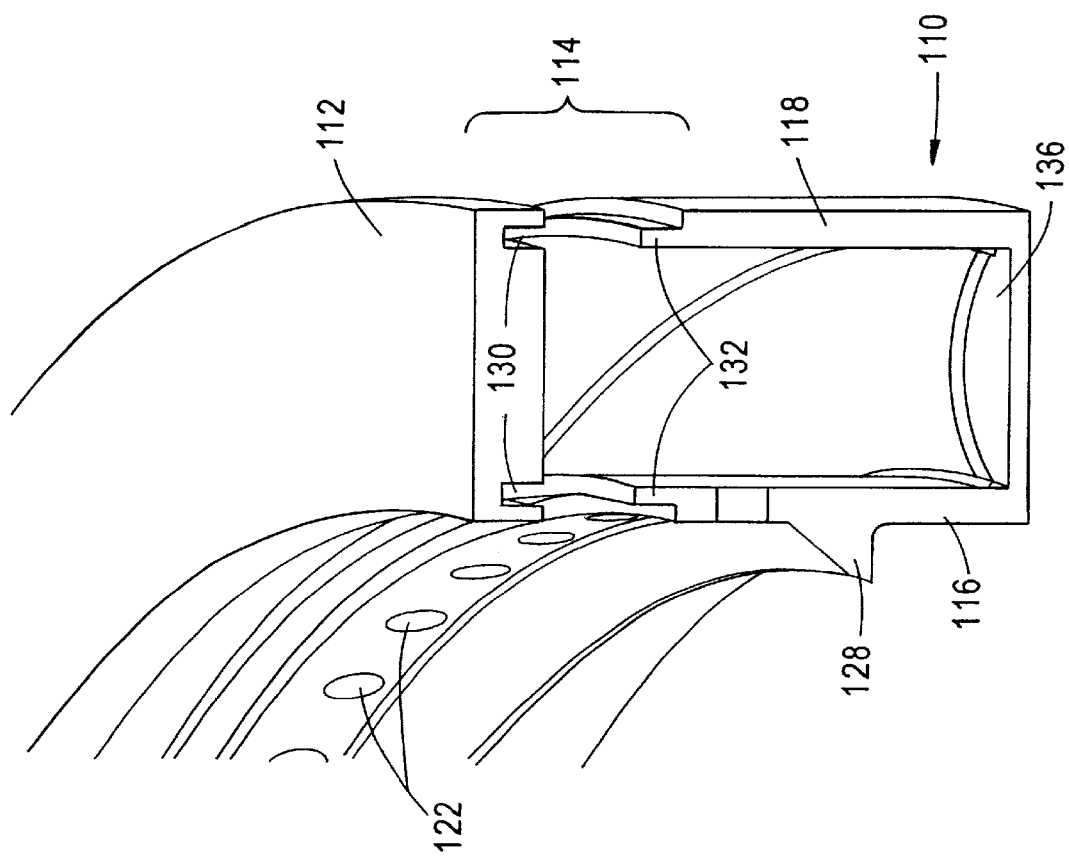
FIG. 2 is a perspective cross-sectional view of the gas collector.
Figure 3:
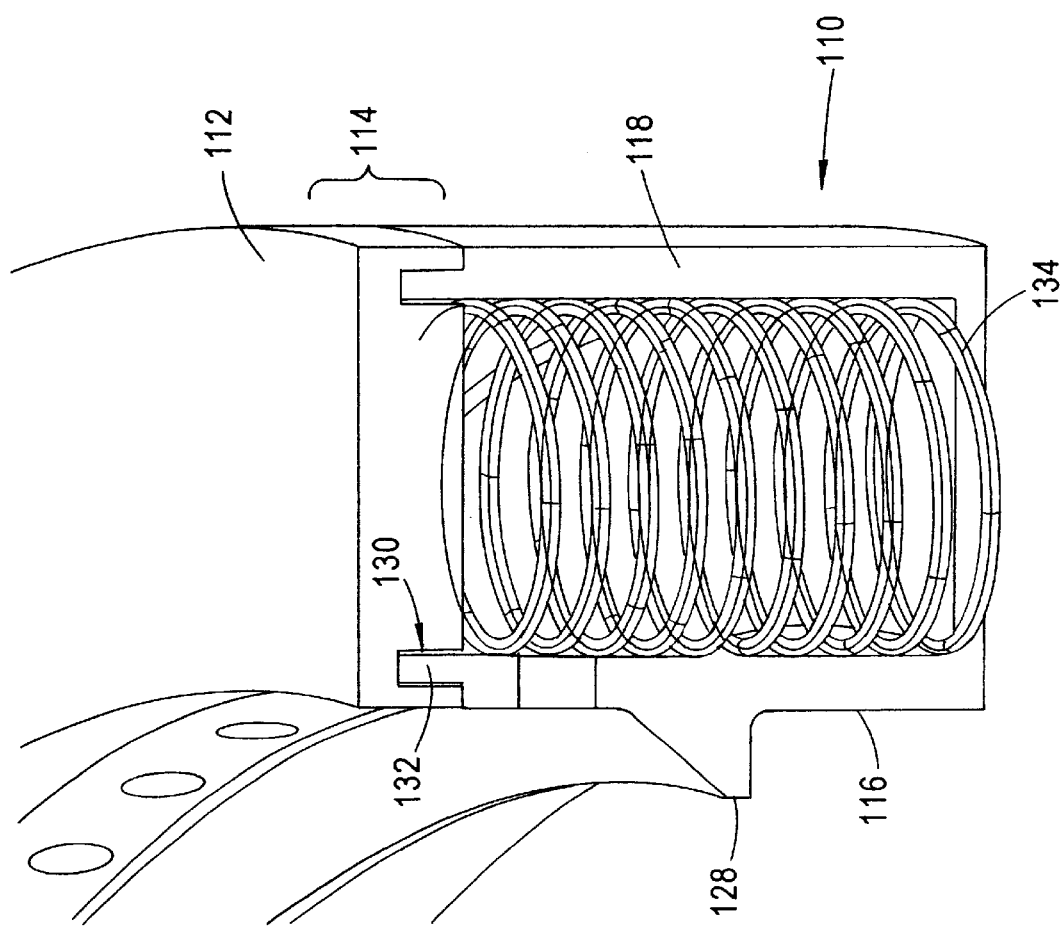
FIG. 3 is a perspective cross-sectional view of the gas collector with a spring positioned within the conduit.

As illustrated in FIGS. 2 and 3, a ledge portion 2 protrudes from the inner wall 116 of the base 110. The ledge portion 2 has a circular configuration that conforms to the shape of the base 110. The ledge portion 2 functions to support the gas collector 100 on the epitaxial reactor.

The gas collector 100 of the present invention can be constructed from various types of materials capable of withstanding the operating conditions within the reaction chamber of the epitaxial reactor. The base 110, top portion 112, and springs 134 can be constructed from any of a plurality of high temperature metals and alloys, such as Iconel. For example, the gas collector 100 can be constructed from stainless steel, Molybdenum, graphite, etc.

In the previous descriptions, numerous specific details are set forth, such as specific materials, structures, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A gas collector for an epitaxial reactor comprising:
   a base having a U-shaped cross-section and a circular configuration;

a top portion configured to cover said base and define a conduit between said base and said top portion;

a sealing arrangement operatively coupled to said base and said top portion;

a plurality of inlets for directing chemical vapors from the reactor into said conduit; and at least one outlet for directing the chemical vapors from said conduit to an exhaust pipe of said epitaxial reactor;

whereby a gas seal can be formed between a lid of said epitaxial reactor and said top portion.

2. The gas collector of claim 1, wherein said plurality of inlets are circumferentially disposed on an inner wall of said base.

3. The gas collector of claim 1, wherein said at least one outlet is disposed on an outer wall of said base.

4. The gas collector of claim 3, wherein said at least one outlet comprises a pair of apertures disposed diametrically opposite of each other.

5. The gas collector of claim 1, wherein said base and said top portion are constructed from graphite.

6. The gas collector of claim 1, wherein said base and said top portion are constructed from molybdenum.

7. The gas collector of claim 1, wherein said base and said top portion are constructed from stainless steel.

8. The gas collector of claim 1, further comprising a ledge portion extending radially from an inner wall of said base and at a location below said plurality of inlets.

9. The gas collector of claim 1, further comprising at least one secondary inlet disposed on an outer wall of said base for directing purge gas into said conduit.

10. The gas collector of claim 1, wherein said sealing arrangement comprises:

a pair of concentric grooves disposed on a bottom surface of said top portion; and a pair of mating projections extending from inner and outer walls of said base, said pair of mating projections being for engagement with said concentric grooves.

11. The gas collector of claim 10, further comprising a plurality of resilient members disposed within said base, each said resilient member having an end in contact with said top portion.

12. The gas collector of claim 11, wherein said resilient members are in the form of helical springs.

13. The gas collector of claim 12, wherein said base includes a plurality of seats, and each said helical spring is disposed within a seat.

14. The gas collector of claim 13, wherein each said helical spring has a diameter substantially equal to the size of said conduit.

* * * * *

UNITED STATES PATENT AND TRADEMARK OFFICE
CERTIFICATE OF CORRECTION

PATENT NO. : 6,325,855 B1
DATED : December 4, 2001
INVENTOR(S) : Roger S. Sillmon et al.

It is certified that error appears in the above-identified patent and that said Letters Patent is hereby corrected as shown below:

Column 1,
Line 59, after "seal", insert -- to --;

Column 3,
Line 11, change "188" to -- 118 --;

Column 4,
Lines 36, 38 and 39, change "2" to -- 128 --.

Signed and Sealed this

Twenty-first Day of May, 2002

Attest:

Attesting Officer

JAMES E. ROGAN
Director of the United States Patent and Trademark Office